US007606499B2

(12) United States Patent
Pan et al.

(10) Patent No.: US 7,606,499 B2
(45) Date of Patent: Oct. 20, 2009

(54) BIDIRECTIONAL TRANSCEIVER ASSEMBLY FOR POF APPLICATION

(75) Inventors: Dong Pan, Andover, MA (US); Jurgen Michel, Arlington, MA (US); Edward H. Sargent, Somerville, MA (US); Wojciech P. Giziewicz, Cambridge, MA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 521 days.

(21) Appl. No.: 11/194,343

(22) Filed: Aug. 1, 2005

(65) Prior Publication Data

US 2007/0025405 A1 Feb. 1, 2007

(51) Int. Cl.
*H04B 10/00* (2006.01)
(52) U.S. Cl. .................. 398/164; 398/136; 398/138; 398/130
(58) Field of Classification Search .............. 398/164, 398/138, 139, 182, 135, 136, 130, 128
See application file for complete search history.

(56) References Cited

U.S. PATENT DOCUMENTS

| 5,031,188 | A | * | 7/1991 | Koch et al. ............... 372/50.11 |
| 5,479,544 | A | * | 12/1995 | Ono et al. ..................... 385/37 |
| 6,496,291 | B1 | * | 12/2002 | Raj et al. ..................... 398/164 |
| 7,058,309 | B1 | * | 6/2006 | Eisenberger et al. .......... 398/135 |
| 2002/0080457 | A1 | * | 6/2002 | Nakanishi et al. ........... 359/189 |
| 2003/0043426 | A1 | * | 3/2003 | Baker et al. ................. 359/109 |
| 2003/0207493 | A1 | | 11/2003 | Trezza et al. |
| 2004/0126117 | A1 | * | 7/2004 | Lo et al. ..................... 398/139 |
| 2005/0019038 | A1 | * | 1/2005 | Ikeda ......................... 398/164 |
| 2005/0031354 | A1 | | 2/2005 | Ohashi et al. |
| 2005/0212089 | A1 | * | 9/2005 | Kiyomoto et al. ........... 257/601 |
| 2005/0286906 | A1 | * | 12/2005 | Togami et al. ............. 398/164 |
| 2006/0172497 | A1 | * | 8/2006 | Hareland et al. ............ 438/286 |
| 2008/0085120 | A1 | * | 4/2008 | Xie et al. .................... 398/135 |

FOREIGN PATENT DOCUMENTS

| DE | 4444470 | 5/1996 |
| DE | 19834090 | 2/2000 |
| JP | 11-352363 | 12/1999 |
| JP | 2001-242348 | 9/2001 |
| JP | 2003-107302 | 4/2003 |

OTHER PUBLICATIONS

Kunihiko Hara et al., "Surface operating optoelectronic devices and applications to optical parallel processing" Electronics & Communications in Japan Part II-Electronics, Wiley, Hoboken, NJ, US vol. 77, No. 10, Oct. 1, 1994, pp. 45-56, XP 0000545763.
Wipiejewski et al., "Efficient alignment tolerant coupling of vertical-cavity lasers to single-mode fibers" Proceedings of the European Conference on Optical Communication (ECOC) Montreux, Sep. 12, 1993, vol. 2 Conf. 19 XP000492234, pp. 333-336.

* cited by examiner

*Primary Examiner*—M. R. Sedighian
(74) *Attorney, Agent, or Firm*—Gauthier & Connors LLP

(57) ABSTRACT

A bidirectional transceiver assembly includes a VCSEL structure that emits light at a defined wavelength on a substrate structure. A photodetector receives the light. A hole structure is formed on the substrate structure to allow the light from the VCSEL structure to be emitted so as to form an optical path.

31 Claims, 4 Drawing Sheets

BIDIRECTIONAL TRANSCEIVER ASSEMBLY FOR POF APPLICATION

BACKGROUND OF THE INVENTION

The invention relates to the field of bi-directional transceivers, and in particular to a bidirectional transceiver assembly for plastic optical fiber (POF) applications.

With rapid development of HDTV, there is a clear market demand for a very short distance (~30 m) and inexpensive high speed network which will be built for use in homes or buildings. Plastic optical fiber is becoming one of the solutions to provide affordable optical fiber. In order to transmit and receive signals from POF, current generation products require two parallel POFs between terminals, where each fiber is connected with one transmitter and receiver. Therefore, a bi-directional transceiver is highly desired because it only requires one POF fiber between terminals and the cost is greatly reduced.

SUMMARY OF THE INVENTION

According to another aspect of the invention, there is provided a light emitting and receiving device. The device includes a substrate, and a light emitting element provided on the substrate. A photodetector is provided on the substrate. The photodetector includes a light transmitting portion to cause light emitted by the light emitting element to pass therethrough.

According to another aspect of the invention, there is provided a light emitting and receiving device. The device includes a substrate, and a light emitting element provided on the substrate. A photodetector is provided on the substrate. The photodetector includes a light transmitting portion to cause light emitted by the light emitting element to pass therethrough an integrated circuit. An integrated circuit comprises all components of the light emitting device According to another aspect of the invention, there is provided a method for forming a light emitting and receiving device. The method includes providing a substrate, and forming a light emitting element provided on the substrate. A photodetector is formed on the substrate. The method includes forming a light transmitting portion for transmitting light from the light emitting element.

According to another aspect of the invention, there is provided a bidirectional transceiver assembly. The assembly includes a VCSEL structure that emits light at a defined wavelength on a substrate structure. A photodetector receives the light. A hole structure is formed on the substrate structure to allow the light from the VCSEL structure to be emitted so as to form an optical path.

According to another aspect of the invention, there is provided a method of forming a bidirectional transceiver assembly. The method includes forming a VCSEL structure that emits light at a defined wavelength on a substrate structure. A photodetector is form that receives the light. Moreover, the method includes forming a hole structure on said substrate structure to allow the light from said VCSEL structure to be emitted so as to form an optical path.

DETAILED DESCRIPTION OF THE INVENTION

Figure 1:
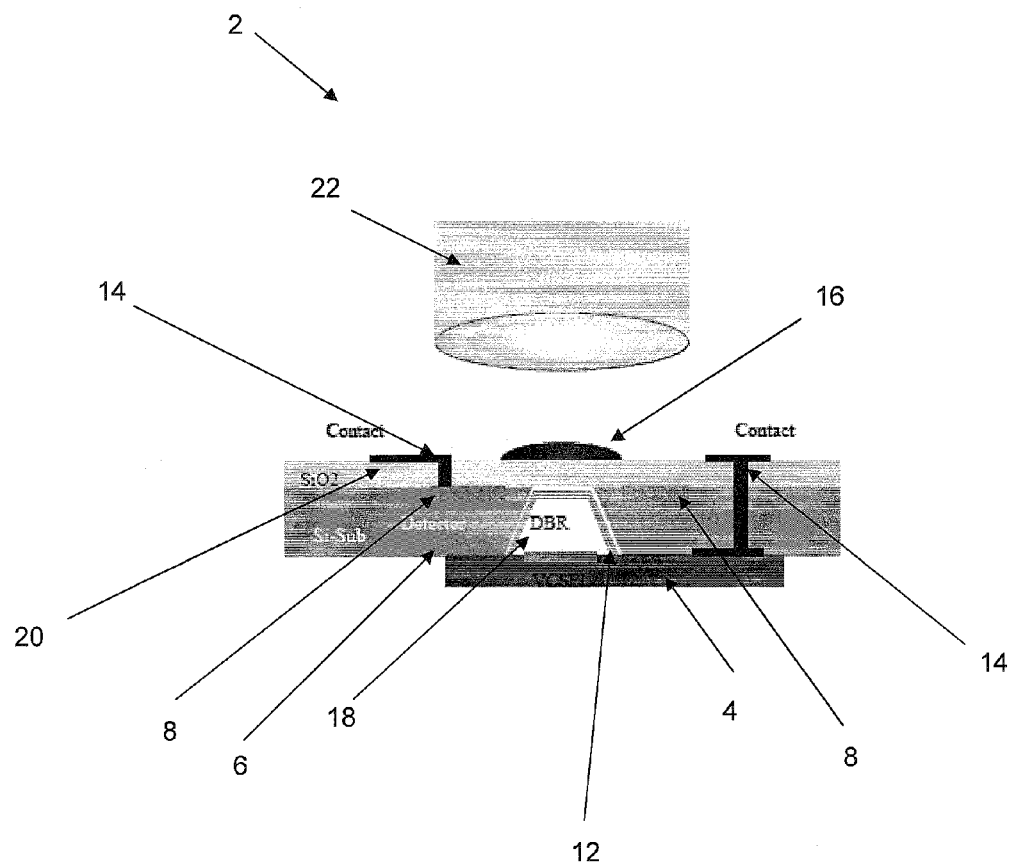
FIG. 1 is schematic diagram demonstrating a bidirectional transceiver assembly configuration.

FIG. 1 illustrates a bidirectional transceiver assembly configuration 2 including a VCSEL 4 with emitting light wavelength of 850 nm or 780 nm vertically mounted on the backside of Si substrate 6. A Si photodetector 8 with a ring structure is fabricated on the Si substrate 10 to receive the incoming light 22 from the POF. A via-hole 12 is etched on the backside of the Si substrate 10 to allow the VCSEL light emitted through the POF. Metal contacts 14 are made on the top of the Si surface 6 by depositing metal on a silicon dioxide layer 20 to create an electrically contact VCSEL. A microlens or small ball lens 16 is placed into the optical path for optical focusing. A multilayer DBR 18 is deposited inside the hole 12 to guide light through the substrate and to form an optical filter to reduce optical cross talk.

The VCSEL emits a stream of light pulses representing the data to be transmitted. The photodetector senses an incident stream of light pulses and generates a corresponding stream of current pulses that is then amplified and detected by electronic circuits. The via hole and DBR guide the VCSEL light through the substrate, from the back to the front where the light subsequently enters the POF and is guided to another transceiver (and detected by a photodetector at said other transceiver).

Figure 2:
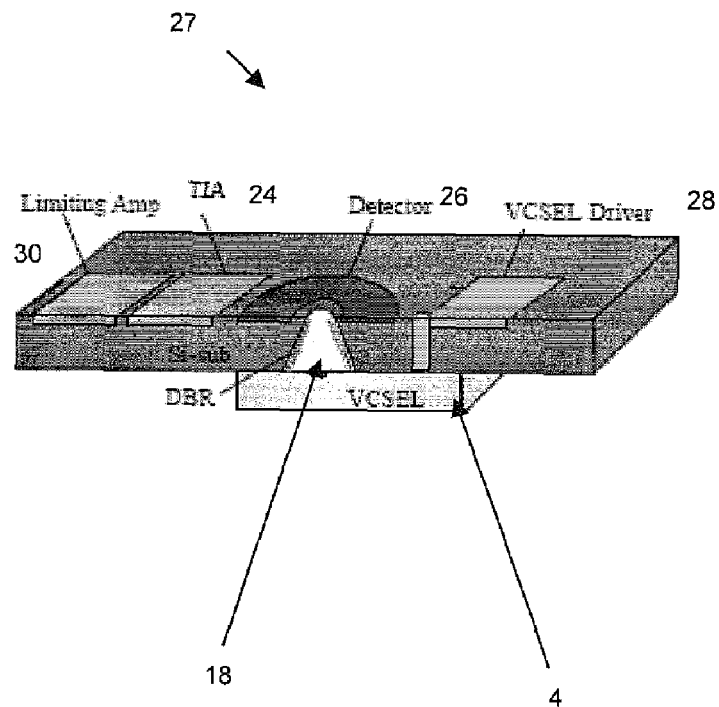
FIG. 2 is schematic diagram demonstrating the top view of the bidirectional transceiver.

FIG. 2 illustrates the top view of the inventive transceiver assembly. The transceiver includes a Si photodetector 26 to receive the incoming light from the POF. Also, the transceiver assembly includes the operation components of the VCSEL 27 such as the limiting amplifier 30, VCSEL driver 28, and TIA 24. Note FIG. 3 demonstrates the monolithic integration of the transceiver assembly.

The VCSEL driver 28 receives a voltage signal corresponding to a stream of data to be transmitted, and converts the voltage signal into a current signal fed to the VCSEL 27, consequently turning the VCSEL 27, on or off, thereby emitting a optical stream of 0's and 1's (i.e. light off and light on). The TIA 24 takes as its input the small current signal generated by the photodetector 26r as a result of an optical stream of pulses impinging onto the photodetector 26, and generates as its output a larger voltage signal linearly proportional to the input current signal. The limiting amplifier 30 takes as its input a voltage signal (typically the output of the TIA 24), and generates a larger voltage signal, but one not exceeding a predetermined level (i.e. the output will be a signal with predetermined amplitude, e.g. 1 volt peak-to-peak, independent of the input signal amplitude as long as the input signal amplitude lies within a certain range as specified by the limiting amplifier design).

The output of the limiting amplifier 30 is suitable for input into output buffers and/or further digital circuits that comprise the entire data transmission system. The advantages of the invention, where all of these circuits are integrated on the same substrate, is a large size, part count, and consequently cost savings when the invention is fabricated using modern VLSI techniques.

FIG. 3 illustrates various hole configurations that can be used with the invention. FIG. 3A shows a hole structure 34 that is formed on the center region of a substrate 36, and FIG. 3B shows a hole structure 38 that is formed on an off-center region of the substrate 36. FIGS. 3C-3D show multiple hole structures formed on the substrate 36, and in particular FIG.

Figure 3A:
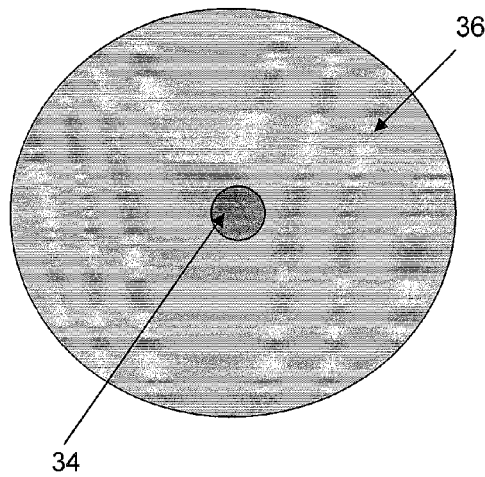
FIG. 3A-3D are schematic diagrams demonstrating the various hole arrangements used in the invention.
Figure 3B:
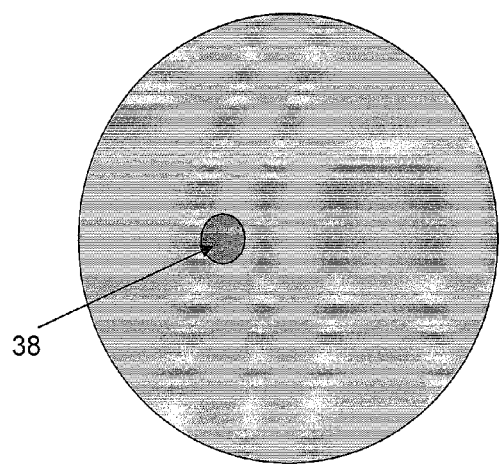
Figure 3C:
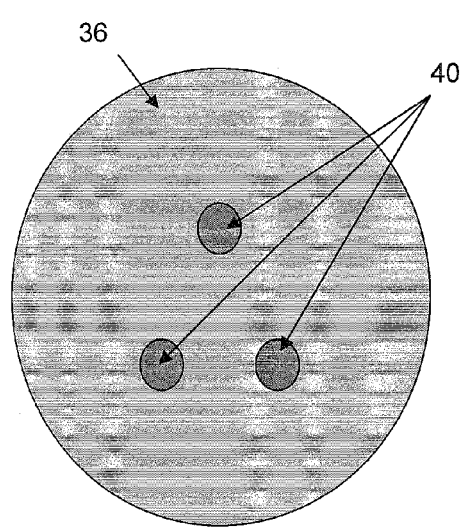
Figure 3D:
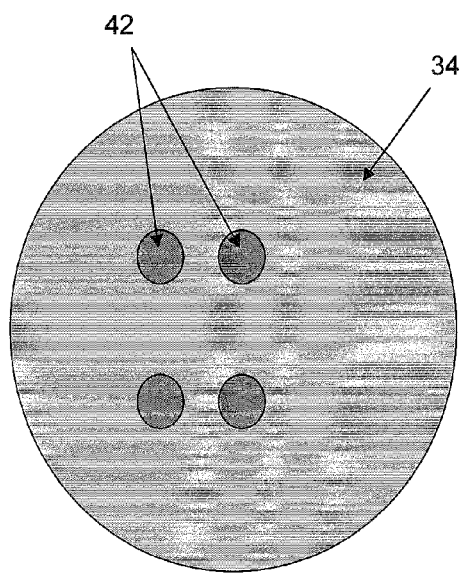

3C having a three hole configuration 40 and FIG. 3D having a four configuration 42. Note the multihole structure include multiple off-center holes.

The reason for putting hole off center is to avoid the light loss and make sure detector receive enough light because the light intensity from POF is highest around the center area and the intensity decrease with the off-center distance. At the same time, the hole opening size can be larger when off-center, which will make the fabrication of via-hole easy. The reason why one can use multiple holes is that one can get more light power from laser. For example, one can use 3 or 4 lasers on one light emitting chip to deliver enough high power to a POF through the holes. The operation will not stop even when one or two lasers are inoperable while other laser sources keep operating.

Figure 4:
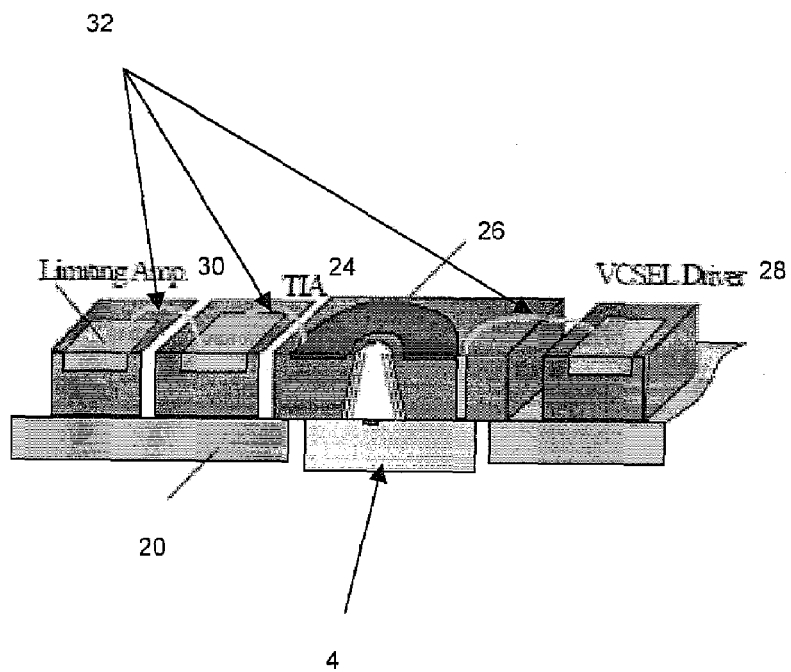
FIG. 4 is schematic diagram demonstrating another embodiment of the bidirectional transceiver.

FIG. 4 illustrates an alternative embodiment of the invention. The transceiver assembly comprises a hybrid integration of the system shown in FIG. 4. Note the VCSEL arrangements such as the limiting amplifier 30, TIA 24, and VCSEL driver 26 are not integrated but modularized. Each component stands on its own and is connected to each other via wires 32 and put them on one holder (i.e. Si substrate, plastic holder, metal leadframe, or ceramic substrate).

The advantages provided by the invention are numerous. The inventive transceiver assembly configuration allows a single POF fiber to receive and transmit an optical signal with low loss. Moreover, the invention can be monolithically formed or use of a hybrid combination. The cost of forming such a structure is relatively less then those presently in the market.

Although the present invention has been shown and described with respect to several preferred embodiments thereof, various changes, omissions and additions to the form and detail thereof, may be made therein, without departing from the spirit and scope of the invention.

What is claimed is:

1. A light emitting and receiving device comprising:
   a substrate;
   a driver element provided on the substrate that receives a voltage signal and produces an electrical signal;
   a light emitting element provided on the substrate, said light emitting element receives said electrical signal to produce emitted light; and
   a photodetector provided on the substrate, said photodetector having a light transmitting portion to cause light emitted by the light emitting element to pass therethrough, said light transmitting portion comprising a hole structure on said substrate to allow the emitted light from said light emitting and receiving device to be emitted so as to form an optical path, and a multilayer DBR that is deposited on the hole structure to form an optical waveguide so as to reduce optical crosstalk.

2. The light emitting and receiving device as defined in claim 1, wherein the substrate is made of a material selected from the group comprising of Si, GaAs, GaN or InP.

3. The light emitting and receiving device as defined in claim 1, further comprising an insulating layer that is provided on the substrate.

4. The light emitting and receiving device as defined in claim 1, wherein said insulating layer comprises $SiO_2$ that is provided on the substrate.

5. The light emitting and receiving device as defined in claim 1, wherein the light emitting element comprises a VCSEL (vertical cavity surface emitting laser), an edge-emitting laser, or a LED.

6. The light emitting and receiving device as defined in claim 1, wherein an insulating layer made of $SiO_2$ is provided on the substrate, and wherein the optical axis of the light emitting element is perpendicular to the surface of the substrate.

7. The light emitting and receiving device as defined in claim 1, wherein the light emitting element is provided on the surface of the substrate opposite to the surface on which the photodetector is provided.

8. The light emitting and receiving device as defined in claim 1, wherein a lens for condensing light from the light emitting element is further provided.

9. The light emitting and receiving device as defined in claim 1, further comprising an electrode that connects the light emitting element and the front surface of the substrate though the substrate.

10. The light emitting and receiving device as defined in claim 9, wherein said electrode comprises of a metal or doped polycrystalline silicon.

11. The light emitting and receiving device as defined in claim 1, wherein the photodetector comprises a MSM (metal-semiconductor-metal), vertical PIN, or a lateral PIN structure.

12. The light emitting and receiving device as defined in claim 1, wherein the light transmitting portion is formed by etching and metal plating or deposition.

13. A light emitting and receiving device comprising:
    a substrate;
    a driver element provided on the substrate that receives a voltage signal and produces an electrical signal;
    a light emitting element provided on the substrate, said light emitting element receives said electrical signal to produce emitted light;
    a photodetector provided on the substrate, said photodetector having a light transmitting portion to cause light emitted by the light emitting element to pass therethrough, said light transmitting portion comprising a hole structure on said substrate to allow the emitted light from said light emitting and receiving device to be emitted so as to form an optical path, and a multilayer DBR that is deposited on the hole structure to form an optical filter so as to reduce optical cross talk; and
    an integrated circuit that comprises all components of said light emitting device.

14. The light emitting and receiving device as defined in claim 13, wherein the integrated circuit comprises any one or combination of a transimpedance amplifier, and limiting amplifier.

15. A method for forming a substrate, the method comprising the steps of:
    providing a substrate;
    forming a driver element provided on the substrate that receives a voltage signal and produces an electrical signal;
    forming a light emitting element on the substrate, said light emitting element receives said electrical signal to produce emitted light;
    forming a photodetector on said substrate; and
    forming a light transmitting portion for transmitting light from the light emitting element, said light transmitting portion comprising a hole structure on said substrate to allow the emitted light from said light emitting and receiving device to be emitted so as to form an optical path, and a multilayer DBR that is deposited on the hole structure to form an optical filter so as to reduce optical cross talk.

16. A bidirectional transceiver assembly:
    a driver element provided on the substrate that receives a voltage signal and produces an electrical signal;

a VCSEL structure that emits light at a defined wavelength on a substrate structure, said VCSEL structure receives said electrical signal to produce emitted light;

a photodetector that receives the light;

a hole structure that is formed on said substrate structure to allow the emitted light from said VCSEL structure to be emitted so as to form an optical path; and a multilayer DBR that is deposited on the hole structure to form an optical filter so as to reduce cross talk.

17. The bidirectional transceiver assembly of claim 16, wherein VCSEL structure emits light wavelength of 850 nm or 780 nm.

18. The bidirectional transceiver assembly of claim 16, wherein VCSEL structure is vertically mounted on the backside of the substrate structure.

19. The bidirectional transceiver assembly of claim 16, wherein said hole structure is etched on the backside of the substrate structure.

20. The bidirectional transceiver assembly of claim 16 further comprising a TIA structure that is formed on the substrate.

21. The bidirectional transceiver assembly of claim 16 further comprising a limiting amplifier is formed on the substrate.

22. The bidirectional transceiver assembly of claim 16, wherein said bidirectional transceiver is monolithically formed.

23. The bidirectional transceiver assembly of claim 16 further comprising a lens structure that is placed into the optical path for optical focusing.

24. A method of forming a bidirectional transceiver assembly:

forming a driver element on the substrate that receives a voltage signal and produces an electrical signal;

forming a VCSEL structure that emits light at a defined wavelength on a substrate structure, said VCSEL structure receives said electrical signal to produce emitted light;

forming a photodetector that receives the light;

forming a hole structure on said substrate structure to allow the emitted light from said VCSEL structure to be emitted so as to form an optical path; and forming a multilayer DBR that is deposited on the hole structure to form an optical filter so as to reduce crosstalk.

25. The method of claim 24, wherein VCSEL structure emits light wavelength of 850 nm or 780 nm.

26. The method of claim 24, wherein VCSEL structure is vertically mounted on the backside of substrate structure.

27. The method of claim 24, wherein said hole structure is etched on the backside of the substrate structure.

28. The method of claim 24 further comprising a TIA structure that is formed on the substrate.

29. The method of claim 24 further comprising forming a limiting amplifier is formed on the substrate.

30. The method of claim 24, wherein said bidirectional transceiver is monolithically formed.

31. The method of claim 24 further comprising providing a lens structure that is placed into the optical path for optical focusing.

* * * * *

UNITED STATES PATENT AND TRADEMARK OFFICE
CERTIFICATE OF CORRECTION

PATENT NO. : 7,606,499 B2  Page 1 of 1
APPLICATION NO. : 11/194343
DATED : October 20, 2009
INVENTOR(S) : Pan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 736 days.

Signed and Sealed this

Twelfth Day of October, 2010

David J. Kappos
*Director of the United States Patent and Trademark Office*